(12) United States Patent
Inoue et al.

(10) Patent No.: US 6,424,075 B1
(45) Date of Patent: Jul. 23, 2002

(54) SURFACE ACOUSTIC WAVE DEVICE AND PRODUCTION METHOD THEREOF

(75) Inventors: Kazuhiro Inoue, Moriyama; Masanobu Watanabe, Kanazawa, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/027,103

(22) Filed: Dec. 26, 2001

(30) Foreign Application Priority Data

Jan. 26, 2001 (JP) ........................................ 2001-019070

(51) Int. Cl.$^7$ ........................ H03H 9/145; H01L 41/047
(52) U.S. Cl. .................... 310/313 R; 310/363; 29/25.65
(58) Field of Search ...................... 29/25.35; 310/313 R, 310/364

(56) References Cited

U.S. PATENT DOCUMENTS

| | | | | |
|---|---|---|---|---|
| 4,130,813 A | * | 12/1978 | Sandy et al. | 29/25.35 |
| 5,460,922 A | * | 10/1995 | Swirbel et al. | 427/259 |
| 6,156,672 A | * | 12/2000 | Koshido et al. | 438/778 |
| 6,259,185 B1 | * | 7/2001 | Lai | 310/313 B |
| 6,297,580 B1 | * | 10/2001 | Takayama et al. | 310/363 |
| 2001/0029648 A1 | * | 10/2001 | Ikada et al. | 29/25.35 |

FOREIGN PATENT DOCUMENTS

| | | | | |
|---|---|---|---|---|
| JP | 53-126879 | * | 11/1978 | .......... H01L/21/88 |
| JP | 55-67211 | * | 5/1980 | ............ H03H/3/08 |
| JP | 61-224713 | * | 10/1986 | ................. 29/25.35 |
| JP | 6-6160 | * | 1/1994 | ................. 29/25.35 |
| JP | 6-120759 | * | 4/1994 | ................. 29/25.35 |

* cited by examiner

*Primary Examiner*—Thomas M. Dougherty
(74) *Attorney, Agent, or Firm*—Ostrolenk, Faber, Gerb & Soffen, LLP

(57) ABSTRACT

A method for producing a surface acoustic wave device includes the steps of forming a resist pattern corresponding to an interdigital electrodes transducer onto a piezoelectric substrate; forming a first electrode layer comprising elemental Ti or a Ti-based alloy onto the piezoelectric substrate and the resist pattern R; forming a second electrode layer which comprises elemental Cu or an Al-based alloy containing at least 2% by weight of Cu (this layer may have a multilayered structure) onto the first electrode layer; and removing both the resist pattern R and unnecessary parts, if any, of the first electrode layer 31 and the second electrode layer to simultaneously pattern the first electrode layer and the second electrode layer. A surface acoustic wave device is constructed according to the above method.

5 Claims, 3 Drawing Sheets

SURFACE ACOUSTIC WAVE DEVICE AND PRODUCTION METHOD THEREOF

BACKGROUND OF THE INVENTION

1. Field of the Invention

The present invention relates to surface acoustic wave devices used for surface acoustic wave resonators, surface acoustic wave filters, and the like, and particularly to high-frequency, high-voltage surface acoustic wave devices, and to a production method thereof.

2. Description of the Related Art

An interdigital electrode transducer for a surface acoustic wave (SAW) device generally includes an elemental Al or Al-based alloy layer which has low electric resistance and a small mass. However, since such layers are not sufficiently resistant to stress migration, hillocks or voids may be formed therein when this happens. Short circuits may be generated when a high voltage is applied to the device with the result that the device will be destroyed.

In order to solve this problem, the following methods have been proposed:

(1) depositing an electrode layer composed of a metal, such as Ti, which ameliorates the orientation of an elemental Al or Al-based alloy layer on a base of the SAW device and then depositing the elemental Al or Al-based alloy layer on the electrode layer; and (2) sandwiching an elemental Cu layer between elemental Al or Al-based alloy layers.

Dry etching, such as RIE or ion milling, has been used for patterning the above electrode layer. Ion milling is effective in etching elemental Cu layers and Al-based alloy layers containing Cu but is not effective in etching Ti layers since the rate of etching elemental Ti layers by ion milling is extremely slow. For this reason, it is necessary to remove the elemental Ti by Reactive Ion Etching (RIE) after the elemental Cu layers and Al-based alloy layers containing Cu are removed by ion milling. Because a plurality of etching techniques are required, several drawbacks arise: complexity of the process; the need for a large investment in different etching equipment; and an increase in production cost of the surface acoustic wave device due to the complexity of the process.

Furthermore, when producing an interdigital electrodes transducer having a width of 1 $\mu$m or less, the following problems arise: deterioration of device characteristics due to the damage caused in the piezoelectric substrate during processing; variation in etching; and low yield.

SUMMARY OF THE INVENTION

In order to solve the above problem, it is an object of the present invention to provide a method for producing a surface acoustic wave device by patterning electrode layers effectively and to provide a surface acoustic wave device, to which high-frequency or high-voltage is applied, according to the above production method.

According to one aspect of the present invention, a method for producing a surface acoustic wave device is provided. The surface acoustic wave device includes a piezoelectric substrate, and an interdigital electrodes transducer arranged on the piezoelectric substrate and a first electrode layer including elemental Ti or a Ti-based alloy and a second electrode layer including elemental Cu or an Al-based metal material containing at least 2% by weight of Cu. The method comprises:

forming a resist pattern corresponding to the interdigital electrodes transducer onto the piezoelectric substrate;

forming the first electrode layer onto both the piezoelectric substrate and the resist pattern by thin-film deposition;

forming the second electrode layer onto the first electrode layer, the second electrode layer including elemental Cu or an Al-based metal material containing at least 2% by weight of Cu (the second electrode layer can have a multilayered structure); and simultaneously removing the resist pattern and the portions of the first and second electrode layers located on the resist pattern to pattern the first electrode layer and the second electrode layer.

In the production method of the surface acoustic wave device according to the present invention, the first electrode layer and the second electrode layer are preferably deposited on both the resist pattern and the piezoelectric substrate through the openings of the resist pattern, and then the unnecessary portions of the first and second electrode layers located on the resist pattern are simultaneously removed along with the resist pattern. The foregoing lift-off procedure allows the first and second electrode layers to be patterned more effectively than the conventional patterning which uses a plurality of etching techniques.

In the above production method, the first electrode layer includes elemental Ti or a Ti-based alloy and the second electrode layer is arranged on the first electrode layer. As a result, orientation in the second electrode layer is excellent and the formation of hillocks or voids is suppressed. Accordingly, electrode layers having high voltage resistance are produced.

The second electrode layer may be a multilayer structure, e.g., one formed by sandwiching a layer including elemental Cu or an Al-base alloy containing at least 2% by weight of Cu between Al electrode layers. Other multilayer structures can also be used.

The present invention is also directed to a production method an interdigital electrodes transducer whose main part has a width of 1 $\mu$m or less.

According to conventional production methods, it is difficult to produce surface acoustic wave devices having interdigital electrodes transducers of whose the main part has a width of 1 $\mu$m or less because the piezoelectric substrates are damaged during the production process. In contrast, the production method of the present invention effectively provides a surface acoustic wave device having an interdigital electrodes transducer whose main part has a width of 1 $\mu$m or less without causing the following disadvantages: damage to the piezoelectric substrate, deterioration of device characteristics, low yield due to variation in etching preciseness.

The present invention is also directed to a surface acoustic wave device comprising:

a piezoelectric substrate;

an interdigital electrodes transducer formed onto the piezoelectric substrate by simultaneously patterning a first electrode layer and a second electrode layer formed on the first layer using a lift-off procedure, wherein the first electrode layer includes elemental Ti or a Ti-based alloy, and the second electrode layer includes elemental Cu or an Al-based metal material containing at least 2% by weight of Cu or the second electrode layer being arranged on the first electrode layer.

The surface acoustic wave device of the present invention is preferably produced by a lift-off procedure in which the first electrode layer and the second electrode layer are patterned at the same time. As a result, formation of hillocks or voids on the piezoelectric substrate is suppressed and the interdigital electrodes transducer has substantially the same dimensions as the design value and includes a second electrode layer having an excellent orientation. Accordingly, the surface acoustic wave device including the interdigital electrodes transducer has the desired characteristics and high reliability.

The present invention is also directed to a surface acoustic wave device having a main part of a width of 1 µm or less.

The surface acoustic wave device is reliably produced without causing decrease in yield due to variation in etching preciseness because the surface acoustic wave device has the above structure.

BRIEF DESCRIPTION OF THE DRAWINGS

Other features and advantages of the present invention will become apparent from the following description of the invention which refers to the accompanying drawings.

DETAILED DESCRIPTION OF EMBODIMENTS OF THE INVENTION

Embodiments according to the present invention will now be disclosed in detail.

Figure 1:
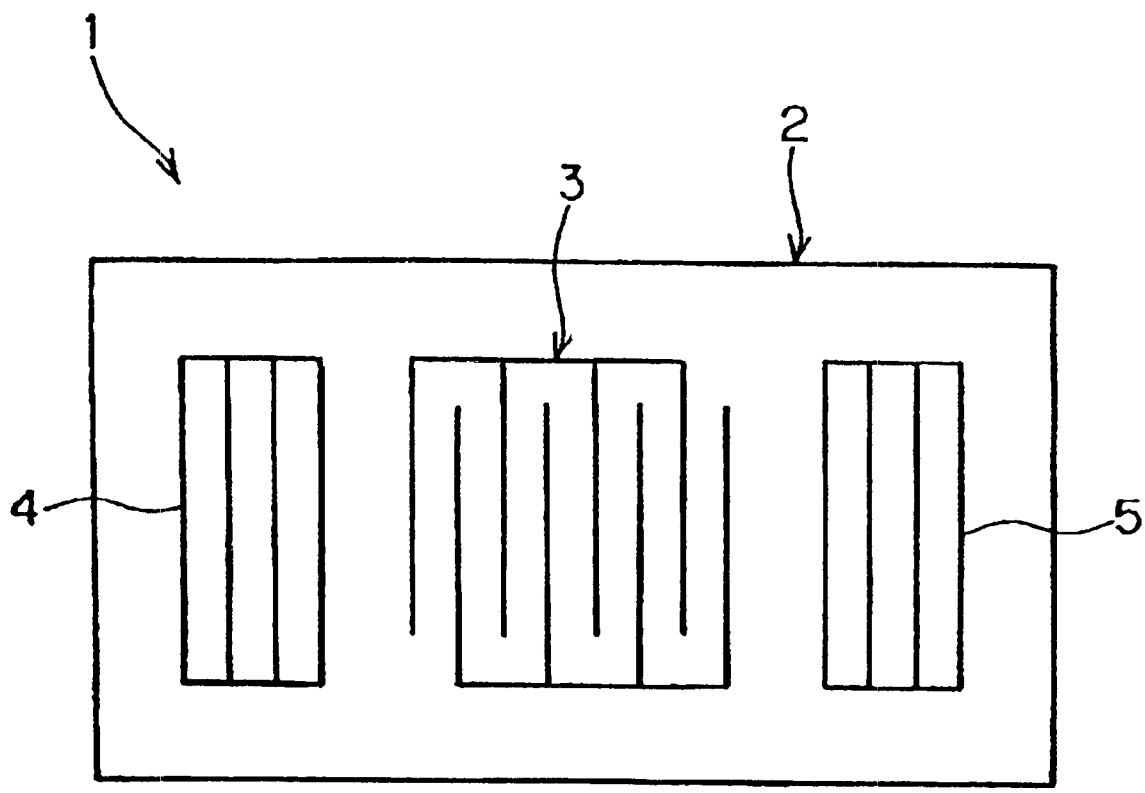
FIG. 1 is a schematic plan view of a surface acoustic wave device according to an embodiment of the present invention.

FIG. 1 is a schematic plan view showing a surface acoustic wave device according to an embodiment of the present invention. The surface acoustic wave device 1 has a structure in which an interdigital electrode transducer (IDT) 3 and reflector electrodes 4 and 5 are arranged on a piezoelectric substrate 2 containing $LiTaO_3$ or $LiNbO_3$. A presently preferred method for producing the surface acoustic wave device 1 will be described below. The invention is not limited to this pattern.

FORMING RESIST PATTERN

Figure 2A:
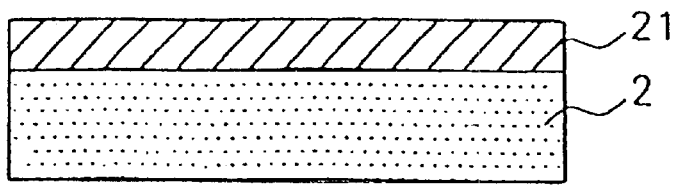
FIGS. 2A to 2E are views illustrating a process for forming a resist pattern on a piezoelectric substrate in the production method of the surface acoustic wave device according to the embodiment of the present invention.
Figure 2B:
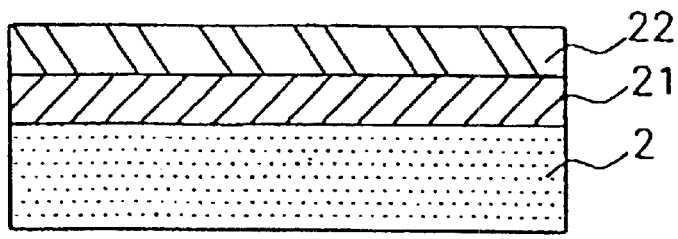
Figure 2C:
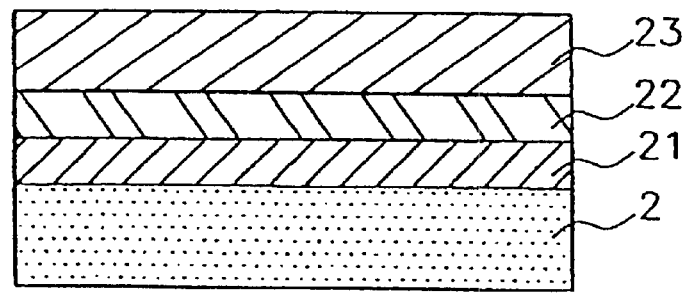
Figure 2D:
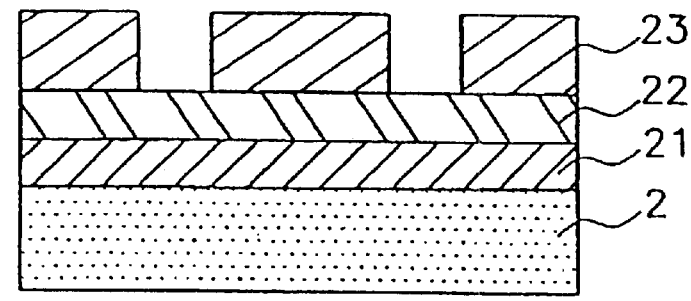
Figure 2E:
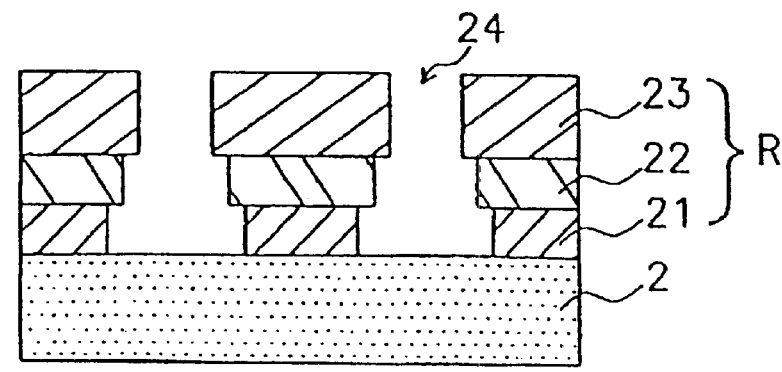

First, a resist pattern R shown in FIG. 2E is formed on the piezoelectric substrate 2 by lithography. The resist pattern R has a three layer structure consisting of a first resist layer 21 located on the piezoelectric substrate 2, a second resist layer 22 located on the first resist layer 21, and a third resist layer 23 located on the second resist layer 22.

Referring to FIGS. 2A to 2E, an exemplary method for forming the resist pattern R will be described below.

(1) Referring to FIG. 2A, a first resist layer 21, preferably having a thickness of 0.12 µm, is formed on the piezoelectric substrate 2 by spin coating. Then, the piezoelectric substrate 2 and first resist layer 21 are baked at 170° C. for 20 minutes. The first resist layer 21 may be composed of an organic material, for example polydimethylglutarimide, which has high solubility in organic solvents and high heat resistance. When heat is applied to the layer composed of such a material during a process for forming metal wiring, distortion of the resist pattern does not arise and the resist material maintains high solubility in organic solvents.

(2) Referring to FIG. 2B, a second resist layer 22, preferably having a thickness of 0.16 µm, is formed on the first resist layer 21 by spin coating. Then, the piezoelectric substrate 2, together with the first and second resist layers 21 and 22, is baked at 155° C. for 1 minute.

The second resist layer 22 is preferably composed of an organic material having high light-absorbance at an exposure wavelength and high heat resistance. Such a material may be selected according to the exposure wavelength. The material is preferably XHRi-16 manufactured by Brewer-Science Co. because of its high light-absorbance when an exposure beam has a wavelength of 365-nm.

(3) Referring to FIG. 2C, a third resist layer 23, preferably having a thickness of 0.34 µm, is formed on the second resist layer 22 by spin coating. Then, the piezoelectric substrate 2, together with the first, second, and third resist layers 21, 22, and 23, is baked at 90° C. for 1 minute.

The third resist layer 23 is preferably composed of an organic material which is resistant to dry etching and to heat. An example of such a material is Fi-SP2 manufactured by Fuji Film Olin Co.

(4) The composite resist (having the three layer structure formed as above) is exposed and developed, and then the third resist layer 23 is patterned as shown in FIG. 2D. Because the second resist layer 22 absorbs a beam of a wavelength used for exposure, a pattern having high resolution and micro openings is formed. Then, UV curing is performed to improve the heat resistance of the resist pattern.

(5) Dry etching (RIE) using oxygen plasma is then performed on the composite resist with the patterned third resist layer 23. As a result, the second resist layer 22 and the first resist layer 21 are partly removed through the openings of the third resist layer 23 to complete patterning.

During this process, the third resist layer 23 is etched at a low etching rate because it is resistant to dry etching. On the other hand, the second resist layer 22 and the first resist layer 21 are etched at an ordinary rate, so that the resist pattern R having an opening 24 and a cross section which tapers toward the opening 24 as shown in FIG. 2E is completed.

The dry etching (RIE) is preferably performed under the following conditions: (1) gas used: oxygen, (2) degree of vacuum: 6.7 Pa, (3) RF power: 300 W, and (4) processing time: 3 minutes.

FORMING INTERDIGITAL ELECTRODES TRANSDUCER

Figure 3:
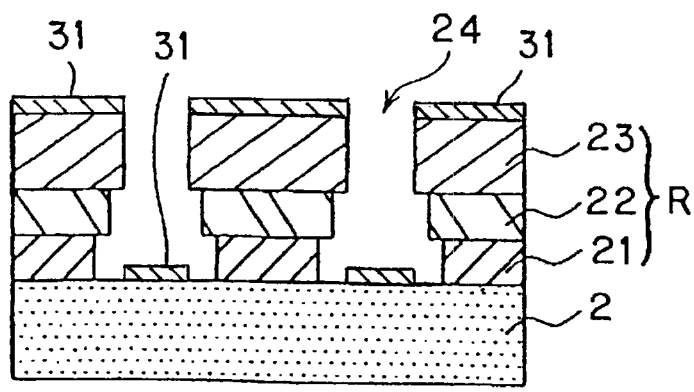
FIG. 3 is a sectional view of a laminate in which a first electrode layer is deposited according to the present invention.

Referring to FIG. 3, a first electrode layer (a Ti electrode layer) 31 is formed on the piezoelectric substrate 2 by electron beam deposition, in which Ti is used as a vapor source. The deposition is preferably performed under the following conditions: (1) deposition temperature: 100° C., (2) deposition rate: 1 nm/s, and (3) thickness: 5 nm. In this process, the first electrode layer 31 is deposited on both the piezoelectric substrate 2 and the resist pattern R.

Figure 4:
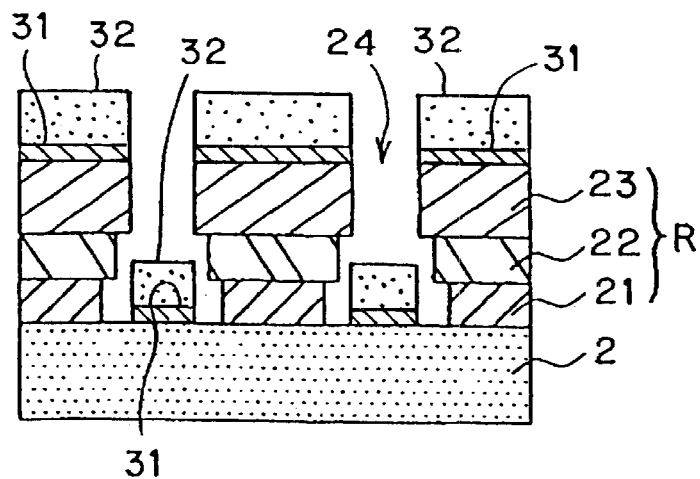
FIG. 4 is a sectional view of the laminate in which a second electrode layer is deposited on the first electrode layer according to the present invention.

Referring to FIG. 4, a second electrode layer 32 is formed on the first electrode layer 31 by electron beam deposition, in which an Al—Cu alloy containing 10% by weight of Cu is used as a vapor source. The deposition is preferably performed under the following conditions: (1) deposition temperature: 100° C., (2) deposition rate: 1 nm/s, and (3) thickness: 200 nm. In this process, the second electrode layer 32 is deposited on both the first electrode layer 31 on the piezoelectric substrate 2 and the first electrode layer 31 on the resist pattern R.

Figure 5:
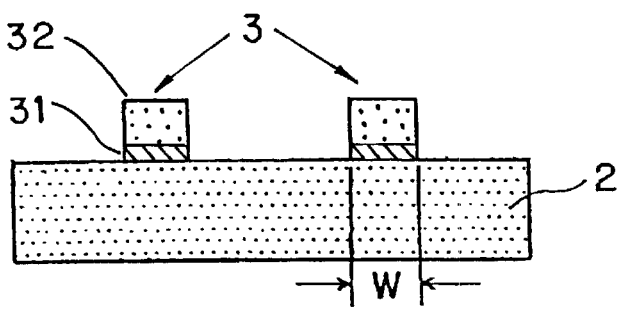
FIG. 5 is a sectional view of an interdigital electrodes transducer formed by lifting off unnecessary portions of the first and second electrode layers in the production method according to an embodiment of the present invention.

The resulting laminate is soaked in acetone (a resist removal solution) to dissolve the resist pattern R and thereby simultaneously remove (lift off) both the resist pattern R and the unnecessary portions of the first and second electrode layers located on the resist pattern R from the piezoelectric substrate 2. As a result, as shown in FIG. 5, the interdigital electrodes transducer 3 having a double layer structure in which the second electrode layer 32 is arranged on the first electrode layer 31 is formed. In this exemplary embodiment, the fingers of the interdigital electrodes transducer 3 have a width W of 0.5 μm. The reflector electrodes 4 and 5 may be also formed in the above-described way.

In the above embodiment, the first electrode layer 31 is deposited on the piezoelectric substrate 2, the second electrode layer 32 is deposited on the first electrode layer 31, and then the unnecessary parts of the first and second electrode layers 31 and 32 located on the resist pattern R are simultaneously removed to form the interdigital electrodes transducer 3. As a result, the interdigital electrode transducer 3 consisting of the first electrode layer 31 and the second electrode layer 32 is effectively formed, in which the second electrode layer (Al—Cu alloy electrode layer) 32 has a small mass and high electric conductivity, and the first electrode layer (Ti electrode layer) 31 ameliorates the orientation of the Al—Cu alloy electrode layer. Accordingly, a surface acoustic wave device having high reliability is efficiently produced without increasing production costs.

The first electrode layer 31 is preferably formed of Ti to ameliorate the orientation of the Al—Cu alloy second electrode layer 32. The second electrode layer 32 is preferably composed of an Al—Cu alloy containing 10% by weight of Cu to improve stress migration resistance, and the first electrode layer 31 and the second electrode layer 32 are patterned at the same time by a lift-off procedure in which the unwanted portion of the first and second layers located on the resist pattern is removed, along with the resist pattern, from the substrate. Thus, the first electrode layer 31 and the second. electrode layer 32 are patterned efficiently and the interdigital electrodes transducer having excellent performance is produced in contrast to the conventional method in which patterning is performed by different etching processes.

According to the above embodiment, the surface acoustic wave device having the above structure is produced by single resist patterning (albeit multiple resist layers) and by continuous deposition using only one electron beam deposition apparatus which reduces costs. As a result, the surface acoustic wave device having high voltage resistance is efficiently produced at a low cost compared to the conventional method in which procedures and conditions of etching differ between layers.

Although, in the above embodiment, the second electrode layer 32 is composed of an Al—Cu alloy containing 10% by weight of Cu, the Cu content may be varied in this embodiment in the range of at least 2% (i.e., 8%–12%) by weight of Cu. Also, in the present invention, the second electrode layer 32 may have a multilayered structure including an electrode layer of elemental Cu or an Al-based metal material containing at least 2% by weight of Cu. In such a structure, the first electrode layer 31, which is the base electrode layer, ameliorates the orientation of the second electrode layer 32. As a result, the generation of hillocks or voids is suppressed and, consequently, the interdigital electrodes transducer having excellent withstand voltage is efficiently produced.

Although, in the above embodiment, the first electrode layer 31 is composed of elemental Ti, the first electrode layer 31 may alternatively be composed of an alloy containing Ti as the main component.

Although, in the above embodiment, the second electrode layer 32 is arranged on the first electrode layer 31, a third electrode layer may be further arranged on the second electrode layer 32.

Although, in the above embodiment, the resist pattern has a three layer structure, the resist pattern is not limited to such a structure (one or more layers can be used) and may be formed by other methods such as an image reverse method.

The present invention is not limited to the above-mentioned embodiments in other respects, and various applications and various modifications may be performed within the scope of the present invention with respect to an electrode pattern, the shape of a piezoelectric substrate, and so on.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for producing a surface acoustic wave device including a piezoelectric substrate, and an interdigital electrodes transducer which is arranged on the piezoelectric substrate and comprises a first electrode layer comprising elemental Ti or a Ti-based alloy and a second electrode layer comprising elemental Cu or an Al-based metal material containing at least 2% by weight of Cu, the method comprising:

forming a resist pattern corresponding to the interdigital electrodes transducer onto the piezoelectric substrate;

forming the first electrode layer onto both the piezoelectric substrate and the resist pattern by thin-film deposition;

forming the second electrode layer onto the first electrode layer; and simultaneously removing the resist pattern together with the portions of the first and second electrode layers located on the resist pattern.

2. A method for producing a surface acoustic wave device according to claim 1, wherein a main part of the interdigital electrodes transducer has a width of 1 μm or less.

3. A method for producing a surface acoustic wave, device according to claim 1, wherein the second electrode layer has a multilayer structure.

4. A surface acoustic wave device comprising:

a piezoelectric substrate; and an interdigital electrodes transducer formed onto the piezoelectric substrate by simultaneously patterning a first electrode layer and a second electrode layer located on the first layer using a lift-off procedure, wherein the first electrode layer comprises elemental Ti or a Ti-based alloy, and the second electrode layer comprises elemental Cu or an Al-based metal material containing at least 2% by weight of Cu.

5. A surface acoustic wave device according to claim 4, wherein the interdigital electrodes transducer has a main part having a width of 1 μm or less.

* * * * *